(12) United States Patent
Matsushima et al.

(10) Patent No.: US 6,187,485 B1
(45) Date of Patent: Feb. 13, 2001

(54) METHOD OF FORMING CONCAVE-CONVEX PATTERN AND USE OF THE METHOD IN THE PRODUCTION OF COLOR FILTERS FOR LIQUID CRYSTAL DISPLAYS

(75) Inventors: Kinji Matsushima; Tomonobu Sumino; Yukihiro Andou, all of Shinjuku-Ku (JP)

(73) Assignee: Dai Nippon Printing Co., Ltd. (JP)

(*) Notice: Under 35 U.S.C. 154(b), the term of this patent shall be extended for 0 days.

(21) Appl. No.: 09/242,956
(22) PCT Filed: Jun. 26, 1998
(86) PCT No.: PCT/JP98/02887
§ 371 Date: Feb. 25, 1999
§ 102(e) Date: Feb. 25, 1999
(87) PCT Pub. No.: WO99/00705
PCT Pub. Date: Jan. 7, 1999

(30) Foreign Application Priority Data

Jun. 26, 1997 (JP) .................................... 9-185865
Jun. 26, 1997 (JP) .................................... 9-185866
Nov. 25, 1997 (JP) .................................... 9-322939

(51) Int. Cl.[7] .......................... G02B 5/20; G02F 1/1335; G03F 7/30
(52) U.S. Cl. ........................ 430/7; 430/325; 430/327; 430/330; 430/396
(58) Field of Search .................. 430/7, 325, 327, 430/330, 396

(56) References Cited

U.S. PATENT DOCUMENTS 4,725,517 * 2/1988 Nakanowatari et al. ............. 430/20
5,631,120 * 5/1997 Swirbel et al. ....................... 430/326

FOREIGN PATENT DOCUMENTS

| 3-200257 | 9/1991 | (JP) . |
| 4-170547 | 6/1992 | (JP) . |
| 4-180066 | 6/1992 | (JP) . |
| 5-295080 | 11/1993 | (JP) . |
| 5-339356 | 12/1993 | (JP) . |
| 8-51266 | 2/1996 | (JP) . |
| 8-110640 | 4/1996 | (JP) . |
| 8-94824 | 4/1996 | (JP) . |
| 8-328242 | 12/1996 | (JP) . |

OTHER PUBLICATIONS

Database WPI, Section Ch, Week 9622, Derwent Publications Ltd., London, GB Class A89, AN 96–212324 XP002111228, Abstract of JP 8–075915 (Mar. 1996).

* cited by examiner

Primary Examiner—John A. McPherson
(74) Attorney, Agent, or Firm—Parkhurts & Wendel, L.L.P.

(57) ABSTRACT

A method of forming raised and recessed patterns comprising: the first step of forming over a substrate a photosensitive resin layer including an alkali-insoluble resin and a negative type photosensitive resin, or the first step of forming over a substrate a photosensitive resin layer including a thermosetting resin and a negative type photosensitive resin and then heat-treating the photosensitive resin layer to harden at least a part of the thermosetting resin; the second step of exposing the photosensitive resin layer; and the third step of developing the photosensitive resin layer and hardening it to form a raised and recessed pattern including raised portions representing an exposed region and recessed portions representing an unexposed region. Liquid crystal display color filters which comprises over the substrate a colored layer, and a transparent protective layer and transparent columnar raised portions formed by one of the above two methods.

11 Claims, 6 Drawing Sheets

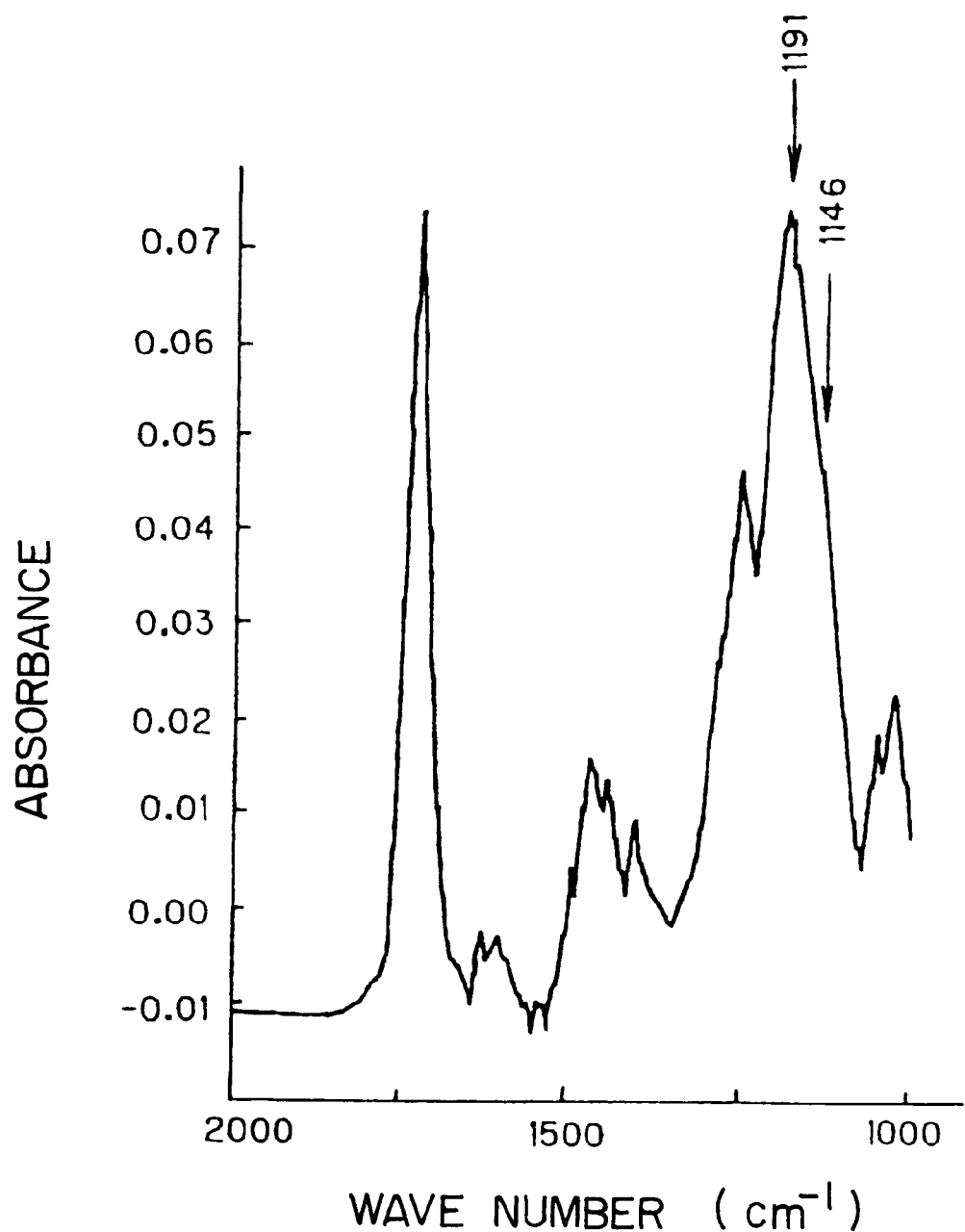
F I G. 5

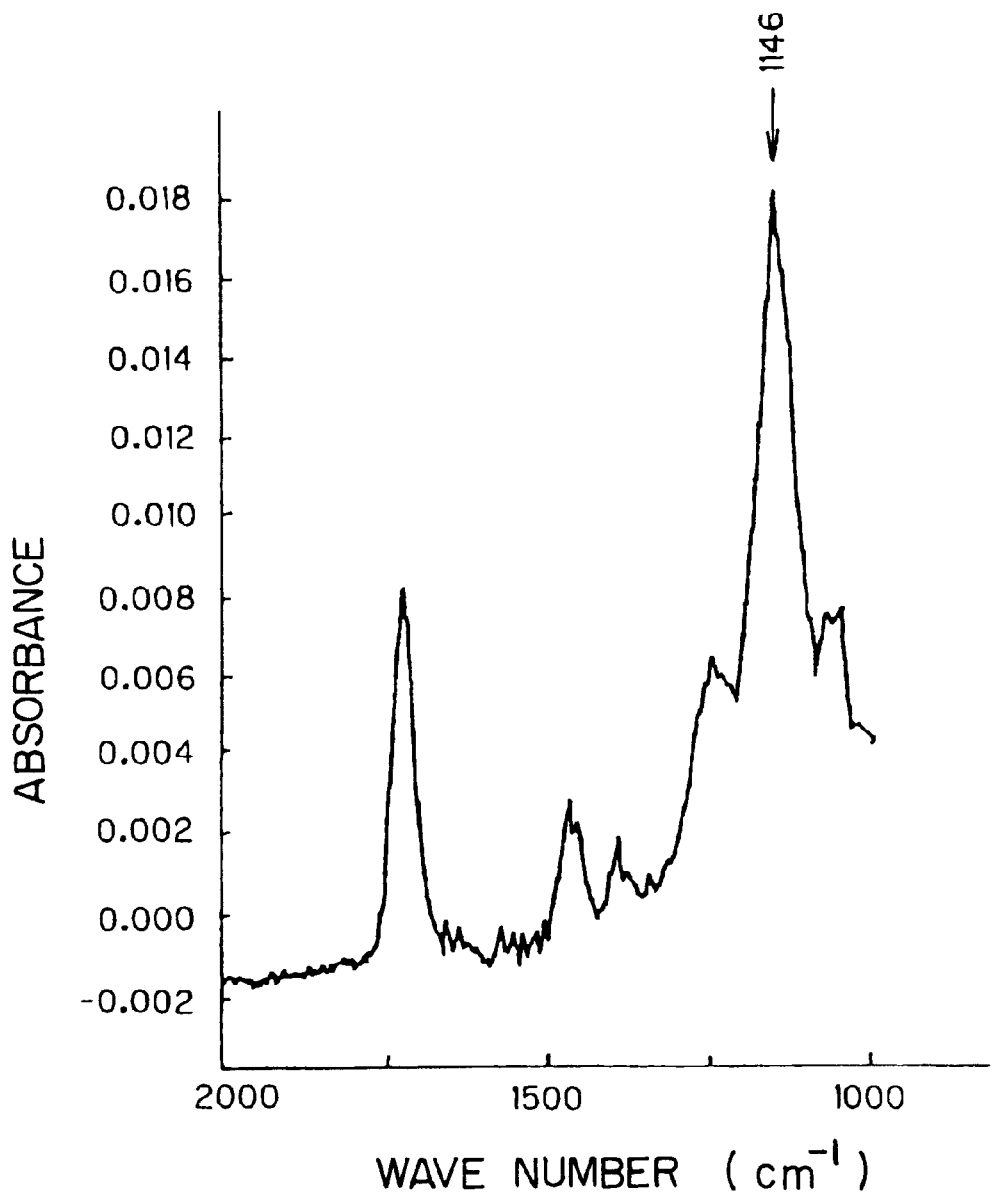
F I G. 6

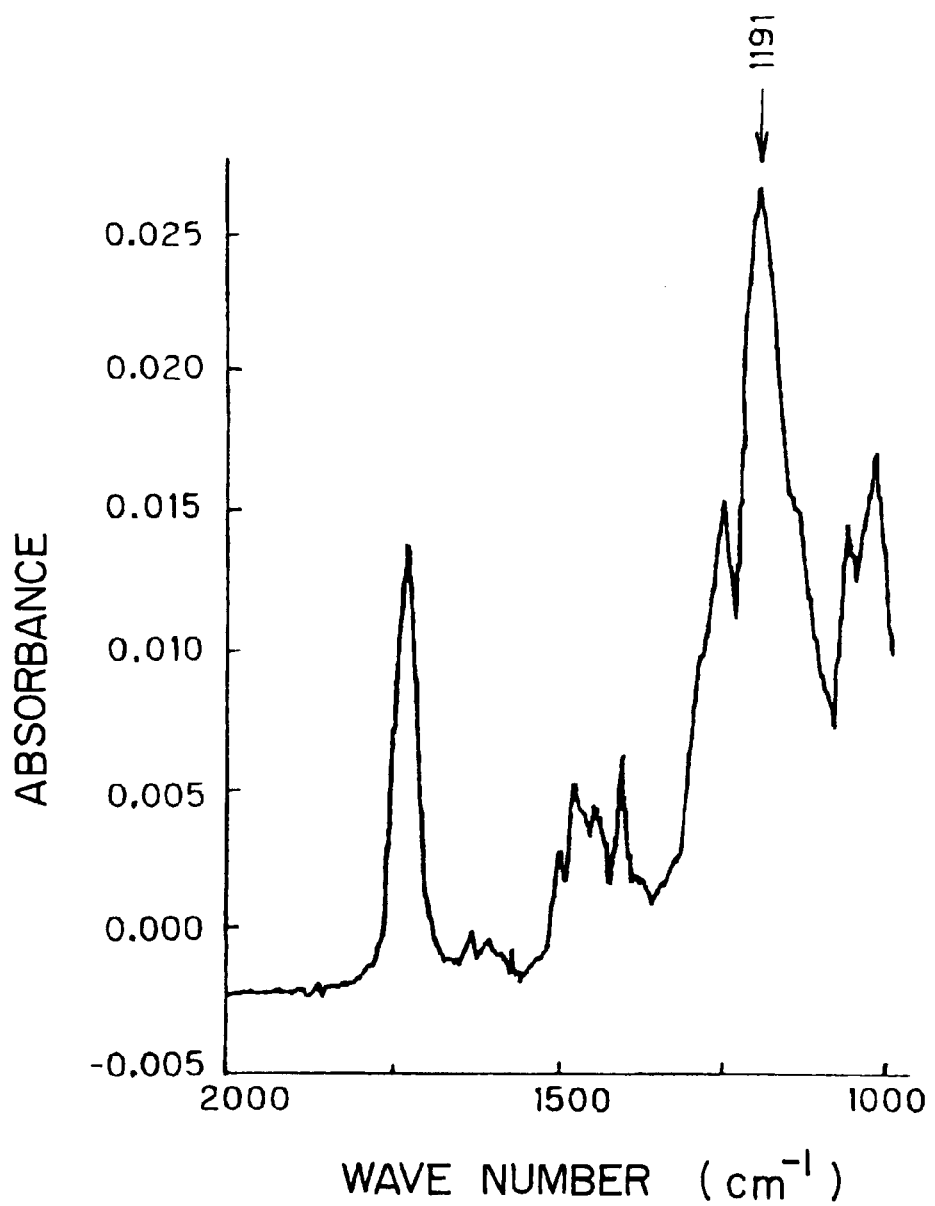
F I G. 7

METHOD OF FORMING CONCAVE-CONVEX PATTERN AND USE OF THE METHOD IN THE PRODUCTION OF COLOR FILTERS FOR LIQUID CRYSTAL DISPLAYS

TECHNICAL FIELD

The present invention relates to a method for forming a concave-convex pattern, and particularly to a method for simply forming a concave-convex pattern which permits the thickness of concaves and the thickness of convexes to be easily regulated. The present invention also relates to use of the above method in the formation of a protective layer and a columnar spacer of color filters for liquid crystal displays. The present invention further relates to a color filter, for liquid crystal displays, which has columnar convexes as spacers and a protective layer having highly regulated thickness.

BACKGROUND ART

Intaglio plates and relief plates for printing, hologram original plates for relief holograms, microlens arrays and other various substrates with a concave-convex pattern formed thereon have been used in the art. For example, microlens arrays comprising microlenses arranged on a substrate have been used as means for efficiently focusing light from an illumination light source onto pixels in color liquid crystal displays (LCD) of a backlight system which have spread in recent years. Further, in color image sensors using CCD and the like, microlenses are arranged on the photoreceptive surface so as to correspond to photoreceptive cells in order to increase the effective numerical aperture. Also in optical fibers which have recently become increasingly used in optical communications and the like, microlenses are used in combination with optical fibers when optical coupling is contemplated.

In conventional methods for forming a concave-convex pattern, a concave-convex pattern is formed by providing a positive-working or negative-working photosensitive resin, exposing the photosensitive resin in a desired pattern, and developing the exposed resin, or by providing a positive-working or negative-working photosensitive resin, forming a mask in a predetermined pattern on a layer of the resin and etching the resin layer through the mask. These conventional methods suffer from problems of troublesome steps and low dimensional accuracy of concaves and convexes constituting the concave-convex pattern.

In recent years, color liquid crystal displays have drawn attention as flat displays. One example of the color liquid crystal displays is such that a color filter comprising a black matrix, a colored layer of a plurality of colors (in general, the three primary colors of red (R), green (G), and blue (B)), a transparent conductive layer (a common electrode), and an aligning layer is provided so as to face a thin film transistor (TFT element) array substrate, comprising a TFT transistor, an pixel electrode, and an aligning layer, while leaving a predetermined gap between the color filter and the TFT array substrate, and a liquid crystal material is poured into the gap to form a liquid crystal layer. In this type of color liquid crystal displays, the gap constitutes the thickness per se of the liquid crystal layer. Therefore, in order to realize good display properties, required of color liquid crystal displays, such as quick response, high contrast ratio, and wide angle of visibility, the thickness of the liquid crystal layer, that is, the distance between the color filter and the TFT array substrate, should be strictly held at a constant value.

A method for determining the thickness of the liquid crystal layer in color liquid crystal displays, which has been recently proposed in the art, is to pour a liquid crystal containing a large number of particles or rods, of glass, alumina, plastics or the like, called a spacer into gaps between the color filter and the TFT array substrate. In this case, the size of the spacer determines the size of the gap between two substrates, that is, the thickness of the liquid crystal layer.

In the above method for forming gaps between the color filter and the TFT array substrate, the following problems occur on the operation of color liquid displays. Specifically, gaps, which are even over the whole area of the color liquid crystal display, cannot be formed unless the density of the spacers dispersed on the surface of the substrate is proper with the spacers being evenly dispersed on the surface of the substrate. The deviation of the scattering in the thickness of gaps generally decreases with increasing the amount (density) of the spacer dispersed. Increasing the amount (density) of the spacers dispersed results in increased number of spacers present on display pixels, and, in the display pixels, the spacers constitute foreign materials in the liquid crystal material. The presence of spacers causes problems, such as disorder in alignment of liquid crystal molecules regulated by the aligning film and impossible regulation of alignment by ON/OFF of the voltage in the liquid crystal around the spacers. This poses a problem of a deterioration in display properties such as contrast ratio.

In order to overcome the above problems, a color filter provided with columnar convexes for determining the gaps (thickness of the liquid crystal layer) has been proposed (Japanese Patent Laid-Open No. 318816/1992 and the like). In this color filter, a colored layer is first formed, and a protective layer is then formed so as to cover the colored layer, followed by formation of columnar convexes using a photosensitive resin again by photolithography on the black matrix in its predetermined portions. This renders the process troublesome.

Further, more accurate regulation of substrate gaps than the regulation in TN liquid crystal modes is required, for example, in IPS (in-plane switching) liquid crystal modes which have recently drawn attractive attention. High coating accuracy of the photosensitive resin is required for regulation of the height of the columnar convexes so as to fall within ±0.3 µm of the contemplated height which is necessary to cope with this demand. This raises problems associated with throughput, yield and the like.

DISCLOSURE OF THE INVENTION

Under the above circumstances, the present invention has been made, and it is an object of the present invention to provide a method for forming a concave-convex pattern with high dimensional accuracy.

It is another object of the present invention to provide a method for forming a transparent protective layer and columnar convexes in color filters for liquid crystal displays which can realize high dimensional accuracy and in addition is simple.

It is a further object of the present invention to provide a color filter for liquid crystal displays wherein the thickness of the columnar convexes as a spacer and the thickness of the protective layer have been regulated with high accuracy.

In order to attain the above objects, according to a first aspect of the present invention, there is provided a method for forming a concave-convex pattern, comprising:

the first step of forming a photosensitive resin layer comprising an alkali-insoluble resin and a negative-working photosensitive resin on a substrate;

the second step of exposing the photosensitive resin layer through a photomask having a desired opening pattern; and the third step of developing the exposed photosensitive resin layer with an alkaline developing solution followed by curing treatment to form a concave-convex pattern consisting of convexes corresponding to the regions exposed in accordance with said opening pattern and concaves corresponding to the non-exposed regions.

According to the second aspect of the present invention, there is provided a method for forming a concave-convex pattern, comprising:

the first step of forming a photosensitive resin layer comprising a thermosetting resin and a negative-working photosensitive resin on a substrate and then heat treating the photosensitive resin layer in such a manner that at least a part of the thermosetting resin is cured;

the second step of exposing the photosensitive resin layer through a photomask having a desired opening pattern; and the third step of developing and curing the photosensitive resin layer to form a concave-convex pattern consisting of convexes corresponding to the regions exposed in accordance with said opening pattern and concaves corresponding to the non-exposed regions.

According to the present invention, there is further provided a color filter for liquid crystal displays, comprising: a substrate; a colored layer of a plurality of predetermined color patterns on the substrate; a transparent protective layer provided so as to cover at least the colored layer; and transparent columnar convexes which are provided on the substrate in its plurality of predetermined portions and are protruded from the transparent protective layer, the transparent protective layer and the columnar convexes having been formed by the method according to any one of the above methods.

According to the present invention, there is still further provided a color filter for liquid crystal displays, comprising: a substrate; a colored layer of a plurality of predetermined color patterns on the substrate; a transparent protective layer provided so as to cover at least the colored layer; and transparent columnar convexes which are provided on the substrate in its plurality of predetermined portions and are protruded from the transparent protective layer, the transparent protective layer being composed mainly of an alkali-insoluble resin or a thermosetting resin, the columnar convexes being composed mainly of a cured negative-working photosensitive resin.

The method for forming a concave-convex pattern using a specific photosensitive resin composition according to the present invention can form a concave-convex pattern by one-stage photolithography. This simplifies the process. Further, properly setting the ratio of the alkali-insoluble resin or the thermosetting resin to the negative-working photosensitive resin in the photosensitive resin layer and/or the exposure can realize simultaneous regulation of the thickness of the concaves and the convexes constituting the concave-convex pattern and the height of the convexes (the depth of the concaves) with high accuracy. Therefore, application of this method to the formation of a protective layer and columnar convexes in color filters for liquid crystal displays enables the height of the convexes and the thickness of the transparent protective layer to be simultaneously regulated. This can also cope with color liquid crystal displays where the thickness of the liquid crystal layer should be regulated with high accuracy, for example, color liquid crystal displays of IPS (in-plane switching) liquid crystal modes.

BRIEF DESCRIPTION OF THE DRAWINGS

FIG. 5 is a diagram showing an infrared absorption spectrum of a convex in a concave-convex pattern formed according to the method of the present invention;

FIG. 6 is a diagram showing an infrared absorption spectrum of a positive-working photosensitive resin; and FIG. 7 is a diagram showing an infrared absorption spectrum of a negative-working photosensitive resin.

BEST MODE FOR CARRYING OUT THE INVENTION

The best mode for carrying out the invention will be described with reference to the accompanying drawings.

Figure 1:
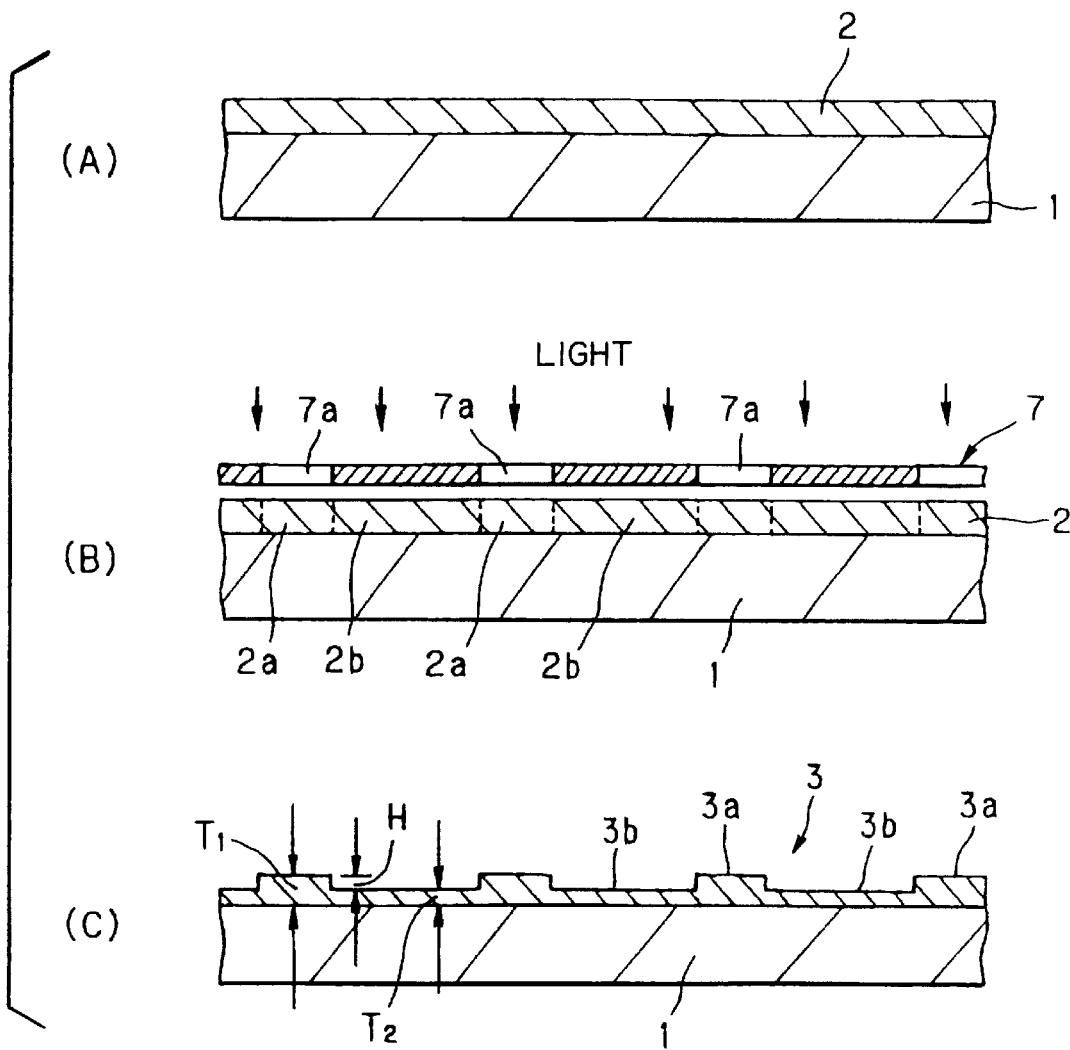
FIG. 1 is a process diagram illustrating one embodiment of the method for forming a concave-convex pattern according to the present invention.

FIG. 1 is a process diagram illustrating one embodiment of the method for forming a concave-convex pattern according to the present invention.

First Step

In the method for forming a concave-convex pattern according to the first aspect of the present invention, a photosensitive resin layer 2 containing an alkali-insoluble resin and a negative-working photosensitive resin in a predetermined ratio is first formed on a substrate 1 (FIG. 1(A)). This photosensitive resin layer 2 may be formed by optimizing the viscosity of a photosensitive resin composition containing the alkali-insoluble resin and the negative photosensitive resin in a predetermined ratio, coating the photosensitive resin composition onto the substrate 1 by conventional means, such as spin coating or roll coating, and drying the coating. The alkali-insoluble resin and the negative-working photosensitive resin used may be selected from conventional alkali-insoluble resins and negative-working photosensitive resins by taking into consideration properties required of the concave-convex pattern, for example, light transmission, heat resistance, chemical resistance, and mechanical strength. Alkali-insoluble resins and negative-working photosensitive resins usable herein include the following resins.

Alkali-insoluble Resins

Alkali-insoluble resins usable herein may be classified roughly into the following positive-working photosensitive resins and non-photosensitive resins.

(Positive-working photosensitive resins)

Basically, polarity-variable transparent positive-working photosensitive resins may be used, and specific examples thereof include positive-working photosensitive resins containing the following resins and photo-induced acid generators.

Resin

† Polyvinyl phenols having protected hydroxyl groups

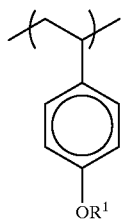

wherein $R^1$ represents a t-butoxycarbonyl, isopropoxycarbonyl, tetrahydropyranyl, trimethylsilyl, or t-butoxycarbonylmethyl group.

† Styrene-maleimide copolymers

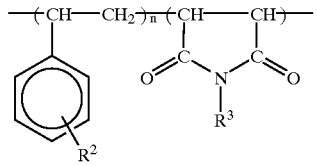

wherein $R^2$ represents a hydrogen atom or an o-tetrahydropyranyl group and $R^3$ represents a t-butoxycarbonyl, phenol-o-t-butoxycarbonyl, or methyleneoxyacetyl group.

Photo-induced Acid Generator

The photo-induced acid generator is a catalyst which eliminates the protective group from the above resin to render the resin soluble in an alkaline developing solution. The photo-induced acid generator is not particularly limited so far as it can form an acid upon exposure to light, and examples thereof include ① onium salts, ② halogen-containing compounds, ③ sulfone compounds, ④ nitrobenzyl compounds, and ⑤ sulfonic acid compounds.

① Onium salts

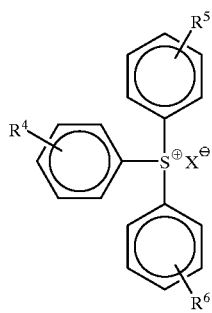

wherein $R^4$ to $R^6$, which may be the same or different, each independently represent a hydrogen atom, an amino, nitro, or cyano group, or a substituted or unsubstituted alkyl or alkoxyl group; and X represents $SbF_6$, $AsF_6$, $PF_6$, $BF_4$, $CF_3CO_2$, $ClO_4$, or $CF_3SO_3$,

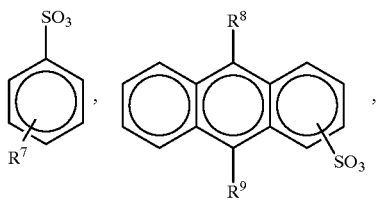

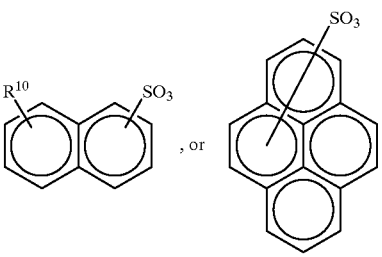

wherein $R^7$ represents a hydrogen atom, an amino or anilino group, or a substituted or unsubstituted alkyl or alkoxy group; $R^8$ and $R^9$, which may be the same or different, each independently represent a substituted or unsubstituted alkoxyl group; and $R^{10}$ represents a hydrogen atom, an amino or anilino group, or a substituted or unsubstituted alkyl or alkoxy group.

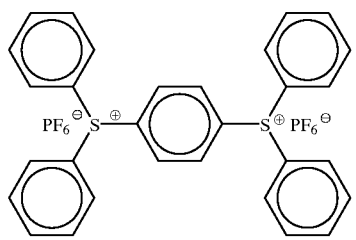

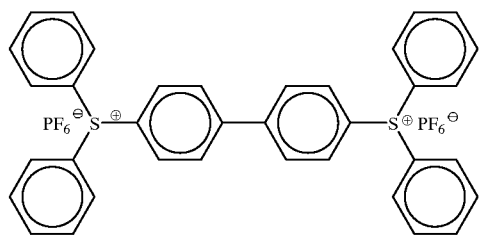

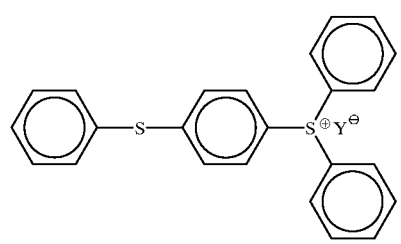

wherein Y represents SbF$_6$, AsF$_6$, PF$_6$, or BF$_4$.

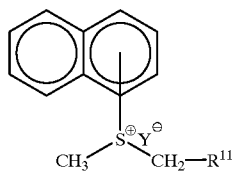

wherein R$^{11}$ represents

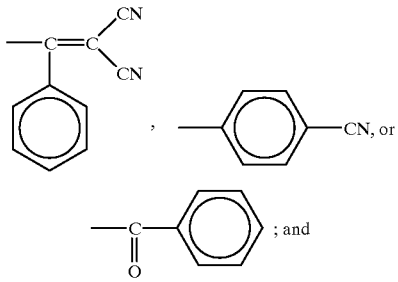

and Y represents BF$_4$ or CF$_3$SO$_3$.

② Halogen-containing Compounds

Halogen-containing compounds usable herein include haloalkyl-containing hydrocarbon compounds and haloalkyl-containing heterocyclic compounds with the following compounds being preferred.

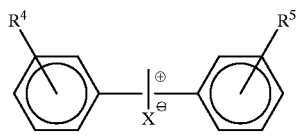

wherein R$^4$, R$^5$, and X are as defined above.

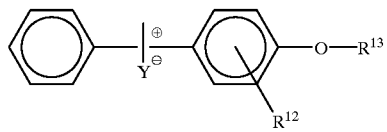

wherein R$^{12}$ represents a hydrogen atom or a methyl group; R$^{13}$ represents C$_n$H$_{2n+1}$ wherein n=8, 10, 11, 12, 14, 15, 16, or 18; and Y represents SbF$_6$ or PF$_6$.

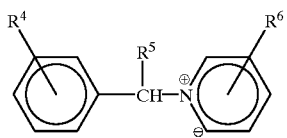

wherein R$^4$ to R$^6$ and X are as defined above.

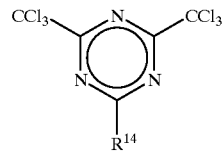

wherein R$^{14}$ represents a trichloromethyl, phenyl, methoxyphenyl, naphthyl, or methoxynaphthyl group.

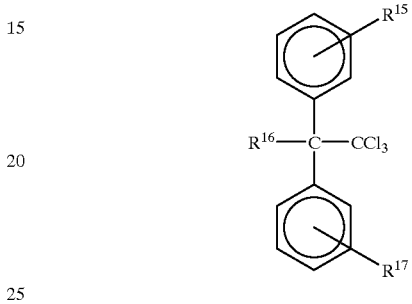

wherein R$^{15}$ to R$^{17}$, which may be the same or different, each independently represent a hydrogen or halogen atom or a methyl, methoxy, or hydroxyl group.

③ Sulfone Compounds

Sulfone compounds usable herein include β-ketosulfone and β-sulfonylsulfone. Preferred sulfone compounds include compounds represented by formula

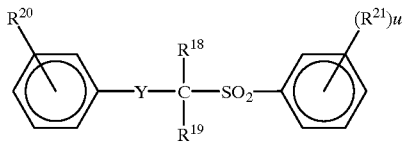

wherein R$^{18}$ to R$^{21}$, which may be the same or different, each independently represent a substituted or unsubstituted alkyl group or a halogen atom; Y represents —CO— or —SO$_2$—; and u is an integer of 0 to 3.

④ Nitrobenzyl Compounds

Nitrobenzyl compounds usable herein include nitrobenzyl sulfonate compounds and dinitrobenzyl sulfonate compounds. Preferred nitrobenzyl compounds include compounds represented by formula

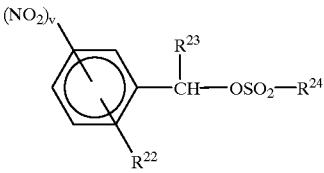

wherein R$^{22}$ represents a substituted or unsubstituted alkyl group; R$^{23}$ represents a hydrogen atom or a methyl group;

and $R^{24}$ represents a compound represented by the following formula:

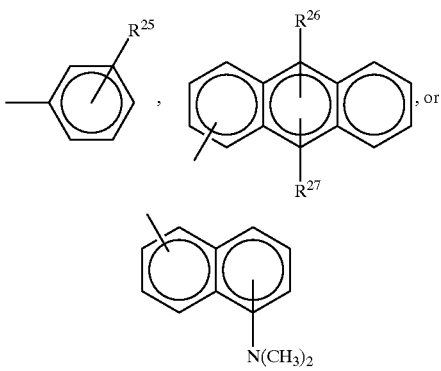

wherein $R^{25}$ represents a hydrogen atom or a methyl group; and $R^{26}$ and $R^{27}$, which may be the same or different, each independently represent a substituted or unsubstituted alkoxyl group; and v is an integer of 1 to 3.

⑤ Sulfonic Acid Compounds

Sulfonic acid compounds usable herein include alkylsulfonic esters, haloalkylsulfonic esters, arylsulfonic esters, and iminosulfonates. Preferred sulfonic acid compounds include compounds represented by formula

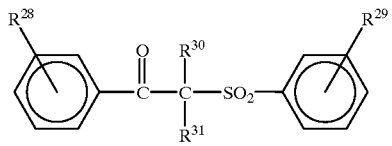

wherein $R^{28}$ and $R^{29}$, which may be the same or different, each independently represent a hydrogen atom or a substituted or unsubstituted alkyl group; and $R^{30}$ and $R^{31}$, which may be the same or different, each independently represent a hydrogen atom or a substituted or unsubstituted alkyl or aryl group.

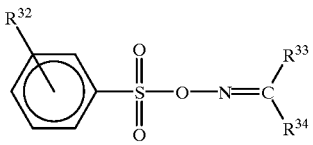

wherein $R^{32}$ represents a hydrogen atom or a substituted or unsubstituted alkyl group; $R^{33}$ and $R^{34}$, which may be the same or different, each independently represent a substituted or unsubstituted alkyl group or aryl group; and $R^{33}$ and $R^{34}$ may combine with each other to form a ring structure.

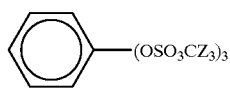

wherein Z represents a fluorine or chlorine atom.

(Non-photosensitive resins)

Non-photosensitive resins usable herein include dihydroxyacrylic esters or polyhydroxyacrylic esters of a copolymer of an epoxy resin with acrylic acid, and bisphenol A epoxy resins.

Negative-working Photosensitive Resin

Negative-working photosensitive resins containing the following resins, polymerization initiators, and monomers may be used.

Resin

Epoxyacrylate resins obtained by reacting epoxy groups contained in bisphenol A epoxy resin, bisphenol F epoxy resin, bisphenol S epoxy resin, novolak type epoxy resin, polycarboxylic acid, glycidyl ester, polyol glycidyl ester, aliphatic or alicyclic epoxy resin, amine epoxy resin, triphenolmethane type epoxy resin, or dihydroxybenzene type epoxy resin, with (meth)acrylic acid; ester compounds obtained by reacting lower alcohols, such as methanol, ethanol, and propanol, or polyhydric alcohols, such as (poly)ethylene glycol, (poly)propylene glycol, glycerin, methylolpropane, pentaerythritol, and dipentaerythritol, with (meth) acrylic acid; ester compounds obtained by reacting N-methylolmelamine, N-methylolbenzoguanamine, (poly)N-methylol(meth) acrylamide or the like with (meth)acrylic acid; products of reactions of polymers, obtained by polymerizing maleic anhydride and copolymerizable monomers, with hydroxyethyl(meth)acrylic acid; and the like. They may be used alone or in combination of two or more.

Polymerization Initiators

The following compounds may be used alone or in combination of two or more.

Irgacure 369 and Irgacure 907 (manufactured by Ciba-Geigy Limited)

KAYACURE DETX (manufactured by Nippon Kayaku Co., Ltd.);

S-123 (manufactured by Shinko Giken K.K.)

2[2'(5"-Methylfuryl)ethylidene]-4,6-bis(trichloromethyl)-s-triazine (manufactured by Sanwa Chemical Co., Ltd.)

2(2'-Furylethylidene) -4,6-bis(trichloromethyl)-s-triazine (manufactured by Sanwa Chemical Co., Ltd.)

TAZ-106 (manufactured by Midori Kagaku Co., Ltd.)

Monomers

Dipentaerythritol acrylate

Pentaerythritol tetraacrylate

The ratio of the alkali-insoluble resin to the negative-working photosensitive resin in the photosensitive resin layer 2 may be properly determined by taking into consideration the thickness of the concaves in the concave-convex pattern, the thickness of the convexes, the height of the convexes (the depth of the concaves), and the exposure in the second step described below. For example, the weight ratio of the positive-working photosensitive resin to the negative-working photosensitive resin may be in the range of 1:2 to 1:10.

The thickness of the photosensitive resin layer 2 may be properly determined by taking into consideration the alkali-insoluble resin and negative-working photosensitive resin used, the thickness of the concaves in the concave-convex pattern, the thickness of the convexes, the height of the convexes (the depth of the concaves) and the like. The thickness is generally in the range of 1 to 10 μm.

The photosensitive resin composition used in the formation of the photosensitive resin layer 2 may contain, besides the alkali-insoluble resin and the negative-working photosensitive resin, a polymerization initiator and a photosensitive crosslinking agent in an amount of 1 to 30% by weight.

The wavelength to which the positive-working photosensitive resin is sensitive may be the same as or different from the wavelength to which the negative-working photosensitive resin is sensitive.

Second Step

In the second step, the photosensitive resin layer 2 is exposed through a photomask 7 for a pattern (FIG. 1(B)). Openings 7a corresponding to convexes in the concave-convex pattern to be formed are provided in the photomask 7.

When the positive-working photosensitive resin is used as the alkali-insoluble resin and, at the same time, in both cases where the wavelength to which the positive-working photosensitive resin is sensitive is the same as the wavelength to which the negative-working photosensitive resin is sensitive and where the wavelength to which the positive-working photosensitive resin is sensitive is different from the wavelength to which the negative-working photosensitive resin is sensitive, the exposure of the photosensitive resin layer 2 is carried out using light containing a wavelength to which both the positive-working photosensitive resin and the negative-working photosensitive resin are sensitive, or light containing a wavelength to which the negative-working photosensitive resin is sensitive. On the other hand, when the non-photosensitive resin is used as the alkali-insoluble resin, the exposure is carried out using light containing a wavelength to which the negative-working photosensitive resin is sensitive.

The exposure may be properly determined by taking into consideration the exposure necessary for allowing the curing reaction of the negative-working photosensitive resin used to satisfactorily proceed, the ratio of the alkali-insoluble resin to the negative-working photosensitive resin, the thickness of the concaves, the thickness of the convexes, the height of the convexes (the depth of the concaves) and the like in the concave-convex pattern. The exposure is generally in the range of 100 to 700 mJ/cm$^2$.

This permits the curing reaction of the negative-working photosensitive resin to proceed in the photosensitive resin layer 2 in its convex-forming portion 2a (portions exposed through the photomask). In this case, when the positive-working photosensitive resin is used as the alkali-insoluble resin and the exposure is carried out using light containing a wavelength to which this resin is sensitive, the decomposition reaction of the positive-working photosensitive resin also proceeds.

Third Step

The third step in the method for forming a concave-convex pattern according to the present invention involves development of the photosensitive resin layer 2 with an alkali developing solution. When the positive-working photosensitive resin is used as the alkali-insoluble resin, as described above, in the second step, the curing reaction of the negative-working photosensitive resin and the decomposition reaction of the positive-working photosensitive resin proceed in the convex-forming portion 2a. Therefore, in this step of development, the positive-working photosensitive resin in the convex-forming portion 2a is dissolved in and removed by the developing solution to form convexes 3a composed mainly of the negative-working photosensitive resin, that is, convexes 3a wherein more than 50% by weight of the chemical composition of the convexes 3a is accounted for by the cured negative-working photosensitive resin. When the non-photosensitive resin is used as the alkali-insoluble resin, in the second step, the curing reaction of the negative-working photosensitive resin proceeds in the convex-forming portion 2a. Therefore, in the convex-forming portions 2a, this step of development results in the formation of convexes 3a composed mainly of the cured negative-working photosensitive resin and the non-photosensitive resin insoluble in the alkali developing solution, that is, convexes 3a wherein more than 50% by weight of the chemical composition of the convexes 3a is accounted for by the cured negative-working photosensitive resin and the non-photosensitive resin.

On the other hand, in regions 2b other than the convex-forming portion 2a in the photosensitive resin layer 2, the unexposed negative-working photosensitive resin is dissolved in and removed by the developing solution to form concaves 3b composed mainly of the alkali-insoluble resin insoluble in the developing solution, that is, concaves 3b wherein 50% by weight of the chemical composition of the concaves 4b is accounted for by the alkali-insoluble resin. Thereafter, post baking is carried out to form a concave-convex pattern comprising convexes 3a and concaves 3b (FIG. 1(C)).

Thus, the concave-convex pattern 3 can be formed by one-stage photolithography. The convexes 3a in the concave-convex pattern 3 thus formed have a flat surface and are even in thickness $T_1$. The concaves 3b in the concave-convex pattern 3 also have a flat surface and are even in thickness $T_2$. Therefore, the height H of the convexes 3a (the depth of the concaves 3b) is even. The thickness $T_1$ of the convexes 3a, the thickness $T_2$ of the concaves 3b, and the height H of the convexes 3a (the depth of the concaves 3b) can be controlled as desired by properly setting the ratio of the positive-working photosensitive resin to the negative-working photosensitive resin in the photosensitive resin layer 2 and/or the exposure. For example, the thickness $T_1$ of the convexes 3a may be properly set in the range of 0.2 to 5 μm, the thickness $T_2$ of the concaves 3b may be properly set in the range of 0.1 to 2 μm, and the height H (the depth of the concaves 3b) of the convexes 3a may be properly set in the range of 0.1 to 4.5 μm. For the convexes 3a and the concaves 3b, the minimum width may be set up to about 8 μm.

Next, the method for forming a concave-convex pattern according to the second aspect of the present invention will be described. The method for forming a concave-convex pattern according to the second aspect of the present invention is substantially the same as the method for forming a concave-convex pattern according to the first aspect of the present invention, except that 1) the photosensitive resin composition contains a thermosetting resin and a negative-working photosensitive resin and 2) the thermosetting resin component is cured after the formation of the photosensitive resin layer on the substrate in the first step. Specifically, the description described above in connection with the method for forming a concave-convex pattern according to the first aspect of the present invention as such may be applied to the method for forming a concave-convex pattern according to the second aspect of the present invention except for the following points.

At the outset, in the first step, a photosensitive resin composition containing the thermosetting resin and the negative-working photosensitive resin are coated on the substrate 1, and the coating is dried to form a photosensitive resin layer 2. Examples of thermosetting resins usable herein include phenolic resins, novolak resins, urea resins, polyester resins, and acrylic resins. Negative-working photosensitive resins usable herein include those described above. As with the method according to the first aspect of the present invention, in the method according to the second aspect of the present invention, the ratio of the amount of the thermosetting resin used to the amount of the negative-working photosensitive resin used may be properly set, for example, in the range of 1:2 to 1:10.

The photosensitive resin layer formed on the substrate is then heat treated so as to cure at least a part of the thermosetting resin component. Preferably, this heat treatment is carried out from the backside (a side on which the photosensitive resin layer is not formed) of the substrate by heating means, such as a hot plate.

In the second step, the photosensitive resin layer 2 after the heat treatment is exposed to light containing a wavelength to which the negative-working photosensitive resin is sensitive in the same manner as described above in connection with the method according to the first aspect of the present invention.

Development in the subsequent third step is also carried out in the same manner as described above in connection with the method according to the first aspect of the present invention. In development with a developing solution, although the thermosetting resin component per se is insoluble or sparingly soluble in an alkali, mixing the thermosetting resin component with a negative-working photosensitive resin permits the photosensitive resin layer 2, formed of the above mixture, in an unexposed and unheated state to be rendered soluble in an alkali developing solution. Therefore, the resin in its portion, around the substrate, which has been heat cured is not dissolved in the developing solution, while the photosensitive resin layer in its portion which has been unsatisfactorily heated and, at the same time, has been unexposed is dissolved in and removed by the developing solution, whereby concaves 3b composed mainly of the thermosetting resin and convexes 3a composed mainly of the exposure-cured negative-working photosensitive resin are formed.

The method according to the second aspect of the present invention can be applied to the formation of various concave-convex patterns, for example, can be advantageously applied to the formation of intaglio plates and relief plates for printing, hologram original plates for relief holograms, microlens arrays, columnar convexes in color filters and the like.

Next, the formation of the transparent protective layer and the columnar convexes in the color filter for liquid crystal displays, which is one preferred embodiment of the method for forming a concave-convex pattern according to the present invention, will be described.

Figure 2:
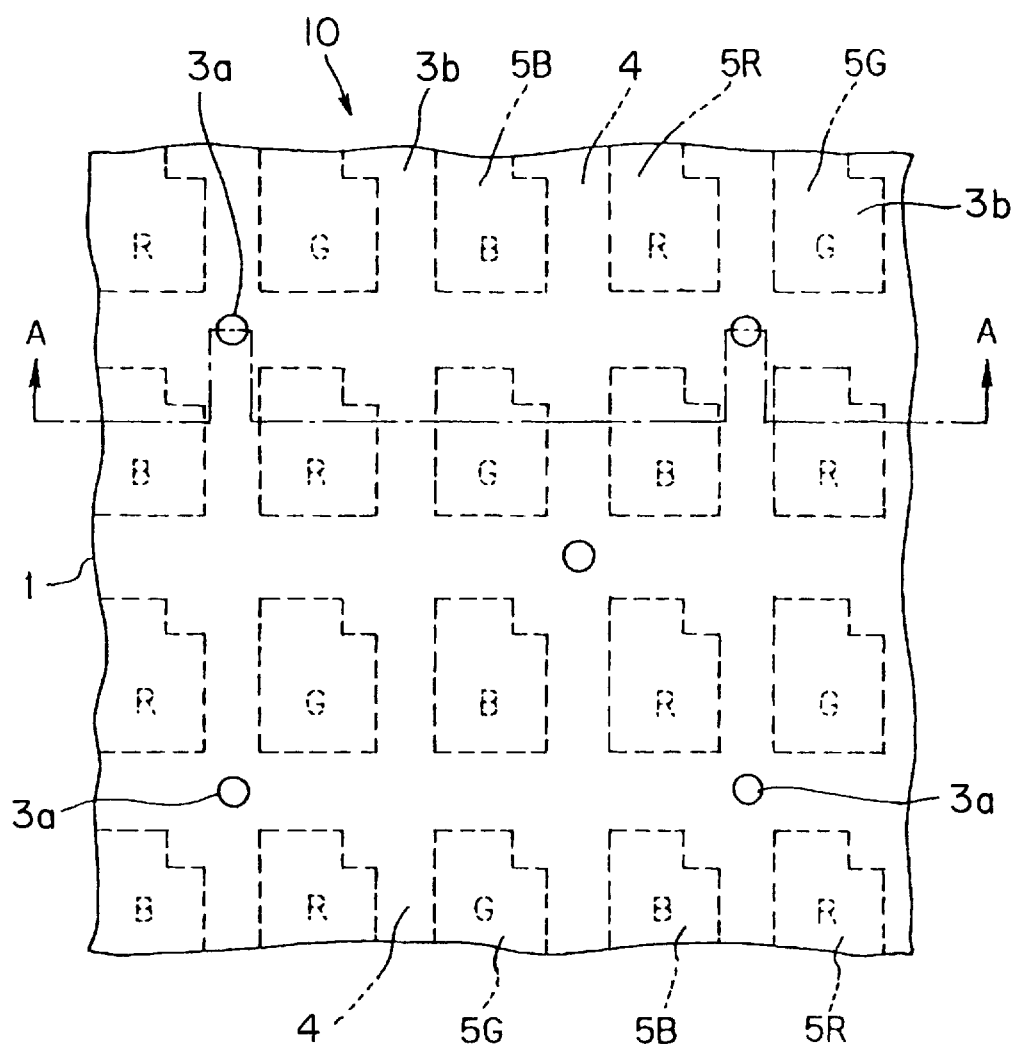
FIG. 2 is a fragmentary plan view showing one embodiment of the color filter for liquid crystal displays according to the present invention.
Figure 3:
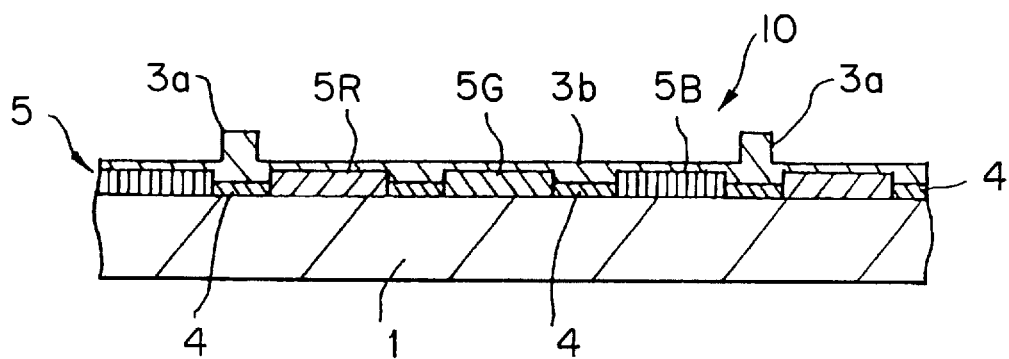
FIG. 3 is a longitudinal sectional view taken on line A—A of FIG. 2.

FIG. 2 is a fragmentary plan view showing one embodiment of the color filter for liquid crystal displays, and FIG. 3 is a longitudinal sectional view taken on line A—A of FIG. 2. In FIGS. 2 and 3, a color filter 10 comprises: a substrate 1; and a black matrix 4 and a colored layer 5 provided on the substrate 1.

Nonflexible, transparent rigid materials, such as quartz glass, Pyrex glass, and synthetic quartz plates, or flexible, transparent materials, such as transparent resin films and optical resin plates, may be used as the substrate 1. Among them, Glass 7059 manufactured by Corning has a small coefficient of thermal expansion, possesses excellent dimensional stability and workability in heat treatment at high temperatures and is an alkali-free glass not containing any alkali component in the glass, and hence is particularly suitable for color filters for color liquid crystal displays of active matrix system.

The black matrix 4 is provided between display pixels of the colored layer 5 and outside the colored layer 5 regions. This black matrix 4 may be formed by forming an about 1000 to 2000 Å-thick metallic thin film of chromium or the like and patterning the thin film, by forming a resin layer of a polyimide resin, an acrylic resin, an epoxy resin or the like containing light-shielding particles, such as fine particles of carbon, and patterning the resin layer, or by forming a photosensitive resin layer containing fine particles of carbon, a metal oxide or the like and patterning the photosensitive resin layer.

The colored layer 5 comprises a red pattern 5R, a green pattern 5G, and a blue pattern 5B in respective desired pattern forms, and may be formed by a pigment dispersion method using photosensitive resins containing desired colorants. The colored layer 5 may also be formed by printing, electrodeposition, transfer and other conventional methods. The colored layer 5 may also be constructed, for example, so that the red pattern 5R has the smallest thickness and the green pattern 5G and the blue pattern 5B are thicker in that order. In this case, the optimal liquid crystal layer thickness for each color in the color layer 5 can be determined.

A transparent protective layer 3b corresponding to the concaves and columnar convexes 3a corresponding to the convexes may be formed on the substrate, with the colored layer and the black matrix being formed thereon, according to the method for forming a concave-convex pattern according to the first or second aspect of the present invention.

The transparent protective layer 3b is provided to flatten the surface of the color filter 10 and to prevent the elution of ingredients contained in the colored layer 5 into the liquid crystal layer. The thickness of the transparent protective layer 3b may be determined by taking into consideration the light transmission of the material used, the surface appearance of the color filter 10 and the like and may be, for example, in the range of 0.1 to 2.0 µm. The transparent protective layer 3b is formed so as to cover at least the colored layer 5 which, when the color filter 10 is laminated onto a TFT array substrate, comes into contact with the liquid crystal layer.

As described above, the transparent protective layer 3b is composed mainly of the alkali-insoluble resin or the thermosetting resin after curing. That is, more than 50% by weight of the transparent protective layer 3b is accounted for by the alkali-insoluble resin or the thermosetting resin after curing. The alkali-insoluble resin or the thermosetting resin is selected by taking into consideration the light transmission and other properties required of the transparent protective layer 3b. The columnar convexes 3a, when the color filter 10 is laminated onto the TFT array substrate, functions as a spacer.

The columnar convexes 3a have such a given height as to protrude by about 2 to 10 µm from the transparent protective layer 3b. The degree of the protrusion may be properly determined by the thickness and the like required of the liquid crystal layer in color liquid crystal displays. The provision density of the columnar convexes 3a may be properly determined by taking into consideration the unevenness in thickness of the liquid crystal layer, the numerical aperture, the shape and material of the columnar convexes 3a and the like. For example, a necessary and sufficient function as a spacer can be developed by providing one columnar convex for each set of the red pattern 5R, the green pattern 5G, and the blue pattern 5B. Although the shape of the convexes 3a constituting the colored layer 5 is shown in the drawing to be columnar, the shape is not limited to this only. For example, the convexes may be in the form of a prism, a truncated cone or the like.

As described above, the columnar convexes 3a are composed mainly of the cured negative-working photosensitive resin. That is, more than 50% by weight of the chemical composition of the columnar convex 3a is accounted for by the cured negative-working photosensitive resin. The negative-working photosensitive resin may be selected from the above negative-working photosensitive resins by taking into consideration the mechanical strength, the light transmission and other properties required of the columnar convexes 3a.

Provision of an aligning layer on the color filter 1 of the present invention provided with the transparent protective layer 3b and the columnar convexes 3a followed by alignment (rubbing) treatment and lamination of the assembly onto the TFT array substrate permits the columnar convexes 3a to create gaps between the color filter 10 and the TFT array substrate. Unlike columnar convexes, formed by laminating three colored layers of R, G, and B, which suffer from unsatisfactory accuracy in height caused by a leveling phenomenon and misregistration for each color, the columnar convexes 3a have very high height accuracy and positional accuracy and consequently can provide very high accuracy in gap between both the substrates. Even though a part of the columnar convex exists in the pixel portion, it hardly have an adverse affect on the display quality because of its transparency. On the other hand, the transparent protective layer 3b flattens the surface of the color filter 10 having fine irregularities to reduce the surface roughness having an adverse effect on the alignment of the liquid crystal and, at the same time, prevents the elution of ionic impurities or the like contained in a very small amount in the colored layer into the liquid crystal layer which aversely affects the display quality.

The following examples further illustrate the present invention.

EXAMPLE 1

A 1.1 mm-thick glass substrate (Glass 7059, manufactured by Corning) having a size of 300 mm×400 mm was provided. Three photosensitive resin compositions A-1, A-2, and A-3 having the following compositions were spin coated on this substrate to form photosensitive resin layers each having a thickness of 5 μm. (First step)

| Formulation of photosensitive resin composition A-1 |  |
|---|---|
| (positive-working resin : negative-working resin = 1:4) |  |
| ↕ Positive-working photosensitive resin TDUR-P007 (wavelength of light to which the resin is sensitive: 254 nm), manufactured by Tokyo Ohka Kogyo Co., Ltd.) | 20 pts. wt. |
| ↕ Negative-working photosensitive resin having the following composition (wavelength of light to which the resin is sensitive: 365 nm) | 80 pts. wt. |
| Resin: bisphenol A cresol novolak epoxy acrylate | 75 pts. wt. |
| Monomer: dipentaerythritol tetraacrylate | 20 pts. wt. |
| Polymerization initiator: Irgacure 369 (manufactured by Ciba-Geigy Limited) | 5 pts. wt. |
| (Solid content of the negative-working photosensitive resin = 35 wt %) |  |

| Formulation of photosensitive resin composition A-2 |  |
|---|---|
| (positive-working resin : negative-working resin = 1:3) |  |
| ↕ Positive-working photosensitive resin TDUR-P007 (wavelength of light to which the resin is sensitive: 254 nm), manufactured by Tokyo Ohka Kogyo Co., Ltd.) | 25 pts. wt. |
| ↕ Negative-working photosensitive resin having the above composition (wavelength of light to which the resin is sensitive: 365 nm) | 75 pts. wt. |

| Formulation of photosensitive resin composition A-3 |  |
|---|---|
| (positive-working resin : negative-working resin = 1:2) |  |
| ↕ Positive-working photosensitive resin TDUR-P007 (wavelength of light to which the resin is sensitive: 254 nm), manufactured by Tokyo Ohka Kogyo Co., Ltd. | 33 pts. wt. |
| ↕ Negative-working photosensitive resin having the above composition (wavelength of light to which the resin is sensitive: 365 nm) | 67 pts. wt. |

The photosensitive resin layers were then exposed at an exposure of 300 mJ/cm$^2$ by means of a proximity exposure machine using an ultrahigh pressure mercury lamp as an exposure light source through a photomask having stripe opening patterns with the line width being varied. (Second step)

The substrates were then developed by immersion in a 0.05% aqueous potassium hydroxide solution for 40 sec, rinsed, and baked in a clean oven at 200° C. for 30 min. (Third step)

A series of steps described above provided stripe-shaped concave-convex patterns. For the concave-convex patterns, the thickness $T_1$ of the convexes, the thickness $T_2$ of the concaves, the height H of the convexes, and the minimum line width which permits the formation of a pattern, were as summarized in Table 1. The results confirm that properly setting the ratio of the positive-working photosensitive resin to the negative-working photosensitive resin in the photosensitive resin composition enables simultaneous regulation of the thickness of the convexes, the thickness of the concaves, and the height of the convexes in the concave-convex pattern.

TABLE 1

| Photosensitive resin composition | Positive: negative | Thickness of convex $T_1$, μm | Thickness of concave $T_2$, μm | Height of convex H ($T_1$–$T_2$), μm | Min. line width, μm |
|---|---|---|---|---|---|
| A-1 | 1:4 | 4.80 | 0.10 | 4.70 | 8 |
| A-2 | 1:3 | 4.60 | 0.60 | 4.00 | 8 |
| A-3 | 1:2 | 4.70 | 1.10 | 3.60 | 10 |

Figure 4:
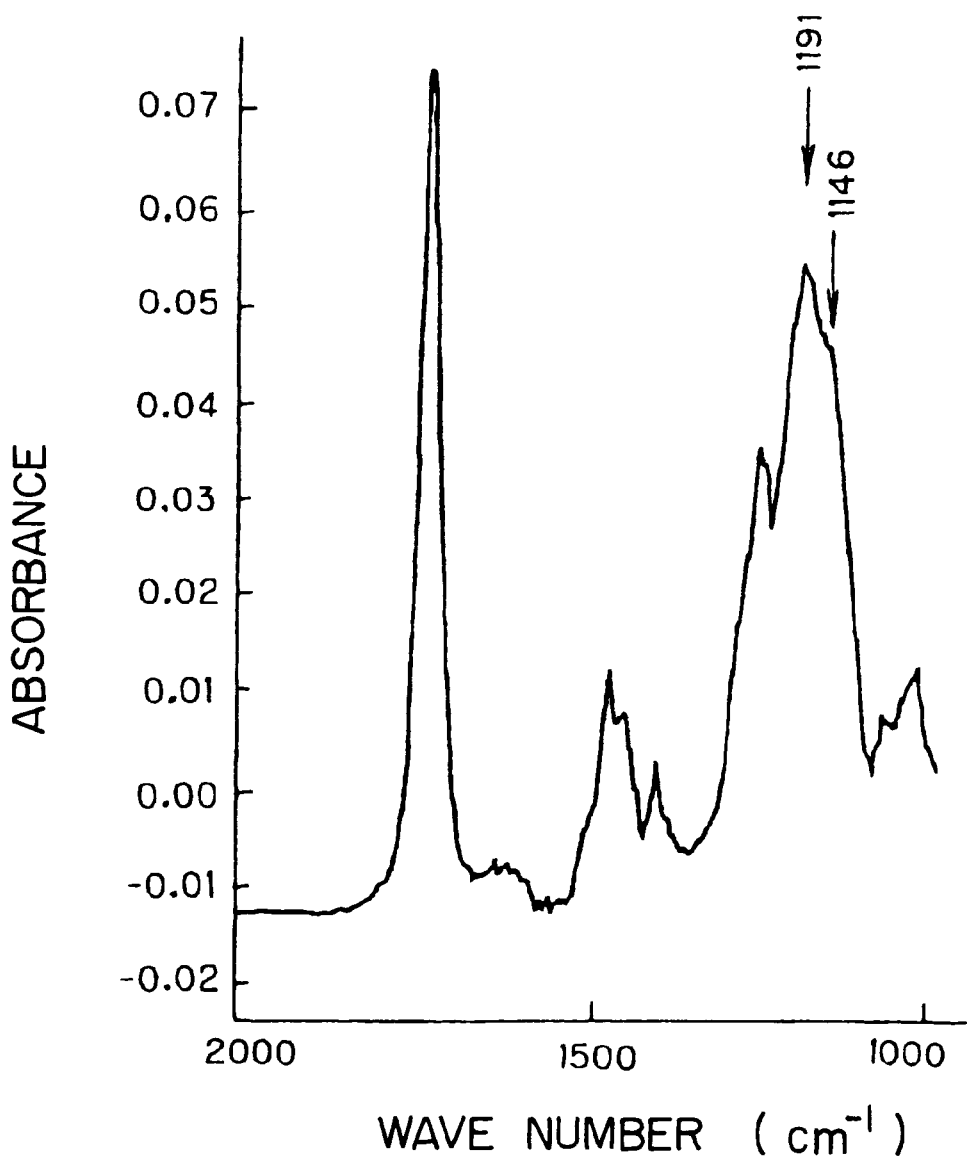
FIG. 4 is a diagram showing an infrared absorption spectrum of a concave in a concave-convex pattern formed according to the method of the present invention.

Further, for the concave-convex pattern prepared using the photosensitive resin composition A-1(sample 1), an infrared absorption spectrum of the concave and an infrared absorption spectrum of the convex were measured with a Fourier transform infrared microscopic measuring device (FT-IR-8200PC, manufactured by Shimadzu Seisakusho Ltd.). The results are shown in FIGS. 4 and 5. Furthermore, for the positive-working photosensitive resin and the negative-working photosensitive resin constituting the photosensitive resin composition A-1, infrared absorption spectra were measured. The results are shown in FIGS. 6 and 7. Attention was focused on an absorption peak at 1146 cm$^{-1}$ characteristic of the positive-working photosensitive resin as shown in FIG. 6 and an absorption peak at 1191 cm$^{-1}$ characteristic of the negative-working photosensitive resin as shown in FIG. 7. Comparison of the proportion of both the absorption peaks in FIG. 4 (an infrared absorption spectrum of the concave) shows that the absorption peak at 1146 cm$^{-1}$ is large, while comparison of the proportion of both the absorption peaks in FIG. 5 (an infrared absorption spectrum of the convex) shows that the absorption peak at 1191 cm$^{-1}$ is large. This confirms that the concave is composed mainly of the unreacted (unexposed) positive-working photosensitive resin, while the convex is composed mainly of the cured negative-working photosensitive resin.

EXAMPLE 2

The photosensitive resin composition A-3 of Example 1 was provided, and a 4.5 μm-thick photosensitive resin layer was formed using the photosensitive resin composition A-3 on the substrate in the same manner as in Example 1. (First step)

The photosensitive resin layer was then exposed by means of a proximity exposure machine using an ultrahigh pressure mercury lamp as an exposure light source through the same photomask as used in Example 1 at exposures on four levels indicated in the following Table 2. (Second step)

Next, the substrate was then developed by immersion in a 0.05% aqueous potassium hydroxide solution for 40 sec, rinsed, and baked in a clean oven at 200° C. for 30 min. (Third step)

A series of steps described above provided a stripe-shaped concave-convex pattern. For the concave-convex pattern, the thickness $T_1$ of the convexes, the thickness $T_2$ of the concaves, the height H of the convexes, and the minimum line width which permits the formation of a pattern were as summarized in Table 2. The results confirm that properly setting the exposure enables simultaneous regulation of the thickness of the convexes, the thickness of the concaves, and the height of the convexes in the concave-convex pattern.

TABLE 2

| Exposure, mJ/cm$^2$ | Thickness of convex $T_1$, μm | Thickness of concave $T_2$, μm | Height of convex H ($T_1-T_2$), μm | Min. line width, μm |
|---|---|---|---|---|
| 100 | 3.49 | 1.66 | 1.83 | 20 |
| 200 | 4.11 | 1.22 | 2.89 | 12 |
| 300 | 4.40 | 1.40 | 3.00 | 10 |
| 500 | 4.44 | 1.10 | 3.34 | 16 |

EXAMPLE 3

Three photosensitive resin compositions B-1, B-2, and B-3 were prepared according to the following formulations and spin coated on the same substrate as used in Example 1. Thus, photosensitive resin layers each having a thickness of 5 μm were formed. (First step)

Formulation of photosensitive resin composition B-1
(positive-working resin : negative-working resin = 1:2)

| | |
|---|---|
| Positive-working photosensitive resin having the following composition (wavelength of light to which the resin is sensitive: 365 nm) | 33 pts. wt. |
| Resin: polyvinyl phenol protected by t-butoxycarbonyl group | 90 pts. wt. |
| Photo-induced acid generator: TFE triazine (manufactured by Sanwa Chemical Co., Ltd.) (Solid content of the positive-working photosensitive resin = 10 wt %) | 10 pts. wt. |
| Negative-working photosensitive resin having the following composition (wavelength of light to which the resin is sensitive: 365 nm) | 67 pts. wt. |
| Resin: bisphenol A cresol novolak epoxy acrylate | 75 pts. wt. |
| Monomer: dipentaerythritol tetraacrylate | 20 pts. wt. |
| Polymerization initiator: Irgacure 369 (manufactured by Ciba-Geigy Limited) (Solid content of the negative-working photosensitive resin = 35 wt % | 5 pts. wt. |

Formulation of photosensitive resin composition B-2
(positive-working resin : negative-working resin = 1:2.5)

| | |
|---|---|
| Positive-working photosensitive resin having the above composition (wavelength of light to which the resin is sensitive: 365 nm) | 29 pts. wt. |
| Negative-working photosensitive resin having the above composition (wavelength of light to which the resin is sensitive: 365 nm) | 71 pts. wt. |

Formulation of photosensitive resin composition B-3
(positive-working resin : negative-working resin = 1:3)

| | |
|---|---|
| Positive-working photosensitive resin having the above composition (wavelength of light to which the resin is sensitive: 365 nm) | 25 pts. wt. |
| Negative-working photosensitive resin having the above composition (wavelength of light to which the resin is sensitive: 365 nm) | 75 pts. wt. |

The photosensitive resin layers were then exposed at an exposure of 300 mJ/cm$^2$ by means of a proximity exposure machine using an ultrahigh pressure mercury lamp as an exposure light source, which applies the wavelength of light to which the negative-working photosensitive resin is sensitive, through the same photomask as described above. (Second step)

The substrates were then developed by immersion in a 0.05% aqueous potassium hydroxide solution for 40 sec, rinsed, and baked in a clean oven at 200° C. for 30 min. (Third step)

A series of steps described above provided stripe-shaped concave-convex patterns. For the concave-convex patterns, the thickness $T_1$ of the convexes, the thickness $T_2$ of the concaves, the height H of the convexes, and the minimum line width which permits the formation of a pattern were as summarized in Table 3. The results confirm that properly setting the ratio of the positive-working photosensitive resin to the negative-working photosensitive resin in the photosensitive resin layer enables simultaneous regulation of the thickness of the convexes, the thickness of the concaves, and the height of the convexes in the concave-convex pattern.

TABLE 3

| Photo-sensitive resin composition | Positive: negative | Thickness of convex $T_1$, $\mu$m | Thickness of concave $T_2$, $\mu$m | Height of convex H $(T_1-T_2)$, $\mu$m | Min. line width, $\mu$m |
|---|---|---|---|---|---|
| B-1 | 1:2 | 3.40 | 0.60 | 2.80 | 10 |
| B-2 | 1:2.5 | 3.20 | 1.10 | 2.10 | 10 |
| B-3 | 1:3 | 3.01 | 2.88 | 0.13 | 14 |

EXAMPLE 4

The photosensitive resin composition B-2 of Example 3 was provided, and a 4.5 $\mu$m-thick photosensitive resin layer was formed using the photosensitive resin composition B-2 in the same manner as in Example 3. (First step)

The photosensitive resin layer was then exposed in the same manner as in Example 3, except that the exposure of light by means of a proximity exposure machine using an ultrahigh pressure mercury lamp as an exposure light source, which applies light in its wavelength to which the negative-working photosensitive resin is sensitive, was varied on four levels as indicated in the following Table 4. (Second step)

Next, the substrate was then developed by immersion in a 0.05% aqueous potassium hydroxide solution for 40 sec, rinsed, and baked in a clean oven at 200° C. for 30 min. (Third step)

A series of steps described above provided a stripe-shaped concave-convex pattern. For the concave-convex pattern, the thickness $T_1$ of the convexes, the thickness $T_2$ of the concaves, the height H of the convexes, and the minimum line width which permits the formation of a pattern were as summarized in Table 4. The results confirm that properly setting the exposure enables simultaneous regulation of the thickness of the convexes, the thickness of the concaves, and the height of the convexes in the concave-convex pattern.

TABLE 4

| Exposure, mJ/cm$^2$ | Thickness of convex $T_1$, $\mu$m | Thickness of concave $T_2$, $\mu$m | Height of convex H $(T_1-T_2)$, $\mu$m | Min. line width, $\mu$m |
|---|---|---|---|---|
| 100 | 3.57 | 0.94 | 2.63 | 14 |
| 200 | 4.26 | 0.57 | 3.69 | 12 |
| 300 | 4.49 | 1.02 | 3.47 | 10 |
| 400 | 4.70 | 0.95 | 3.75 | 16 |

EXAMPLE 5

A quartz glass substrate having a size of 10 cm square (thickness 1.1 mm, refractive index 1.46) was provided as a substrate for a lens, and the photosensitive resin composition A-3 of Example 1 was used to form a 20 $\mu$m-thick photosensitive resin layer on the substrate for a lens in the same manner as in Example 1. (First step)

The photosensitive resin layers were then exposed at an exposure of 300 mJ/cm$^2$ by means of a proximity exposure machine using an ultrahigh pressure mercury lamp as an exposure light source through a photomask with openings having a size of 100 $\mu$m×100 $\mu$m being formed at pitches of 120 $\mu$m. (Second step)

The substrate was then developed by immersion in a 0.05% aqueous potassium hydroxide solution for 40 sec, rinsed, and baked in a clean oven at 200° C. for 30 min.

(Third step)

A series of steps described above provided a microlens array comprising a plurality of microlenses having a size of about 110 $\mu$m square and a focal length of 200 $\mu$m arranged on the substrate.

EXAMPLE 6

A 1.1 mm-thick glass substrate (Glass 7059, manufactured by Corning) was provided. Three photosensitive resin compositions C-1, C-2, and C-3 having the following compositions were spin coated on this substrate to form photosensitive resin layers each having a thickness of 5 $\mu$m. (First step)

| Formulation of photosensitive resin composition C-1 | |
|---|---|
| (alkali-insoluble resin : negative-working resin = 1:5) | |
| Alkali-insoluble resin | 17 pts. wt. |
| Bisphenol A resin (VR-60, manufactured by Showa High Polymer Co., Ltd.) | |
| Negative-working photosensitive resin having the following composition (wavelength of light to which the resin is sensitive: 365 nm) | 83 pts. wt. |
| Resin: bisphenol A cresol novolak epoxy acrylate | 75 pts. wt. |
| Monomer: dipentaerythritol tetraacrylate | 20 pts. wt. |
| Polymerization initiator: Irgacure 369 (manufactured by Ciba-Geigy Limited) | 5 pts. wt. |
| (Solid content of the negative-working photosensitive resin = 35 wt %) | |

| Formulation of photosensitive resin composition C-2 | |
|---|---|
| (alkali-insoluble resin : negative-working resin = 1:7) | |
| The above alkali-insoluble resin | 12.5 pts. wt. |
| Negative-working photosensitive resin having the above composition (wavelength of light to which the resin is sensitive: 365 nm) | 87.5 pts. wt. |

| Formulation of photosensitive resin composition C-3 | |
|---|---|
| (alkali-insoluble resin : negative-working resin = 1:9) | |
| The above alkali-insoluble resin | 10 pts. wt. |
| Negative-working photosensitive resin having the above composition (wavelength of light to which the resin is sensitive: 365 nm) | 90 pts. wt. |

The photosensitive resin layers were then exposed at an exposure of 400 mJ/cm$^2$ by means of a proximity exposure machine using an ultrahigh pressure mercury lamp as an exposure light source through a photomask having stripe opening patterns with the line width being varied. (Second step)

The substrates were then developed by immersion in a 0.05% aqueous potassium hydroxide solution for 40 sec, rinsed, and baked in a clean oven at 200° C. for 30 min. (Third step)

A series of steps described above could provide stripe-shaped concave-convex patterns. For the concave-convex patterns, the thickness $T_1$ of the convexes, the thickness $T_2$ of the concaves, the height H of the convexes, and the minimum line width which permits the formation of a pattern were as summarized in Table 5. The results confirm that properly setting the ratio of the alkali-insoluble resin to the negative-working photosensitive resin in the photosensitive resin layer enables simultaneous regulation of the thickness of the convexes, the thickness of the concaves, and the height of the convexes in the concave-convex pattern.

TABLE 5

| Photo-sensitive resin composition | Positive: negative | Thickness of convex $T_1$, μm | Thickness of concave $T_2$, μm | Height of convex H $(T_1-T_2)$, μm | Min. line width, μm |
|---|---|---|---|---|---|
| C-1 | 1:5 | 5.62 | 1.41 | 4.21 | 14 |
| C-2 | 1:7 | 5.57 | 0.99 | 4.58 | 10 |
| C-3 | 1:9 | 5.35 | 0.32 | 5.03 | 10 |

EXAMPLE 7

The same substrate as used in Example 1, that is, a 1.1 mm-thick glass substrate (7059, manufactured by Corning), was provided as a substrate for a color filter. This substrate was cleaned by a conventional method. A light-shielding layer (thickness 0.1 μm) of metallic chromium was sputtered on the whole area of the substrate in its one side. Next, this light-shielding layer was treated by the conventional photolithography. Specifically, according to the photolithography, a photosensitive resist was coated on the light-shielding layer, exposed through a mask, developed, and etched, and the resist layer was then removed to form a black matrix.

A photosensitive colorant for a red pattern (Color Mosaic CR-7001, manufactured by Fuji Film Olin Co., Ltd.) was then spin coated on the substrate in its whole area with the black matrix formed thereon, thereby forming a red sensitive resin layer. The red sensitive resin layer was then prebaked at 85° C. for 5 min. Thereafter, the red sensitive resin layer was subjected to alignment exposure through a photomask for a predetermined color pattern, developed with a developing solution (a diluted solution of a developing solution CD for a color mosaic, manufactured by Fuji Film Olin Co., Ltd.). Subsequently, post baking was carried out at 200° C. for 30 min to form a red pattern (thickness 1.5 μm) at a predetermined position relative to the black matrix pattern.

Further, a green pattern (thickness 1.5 μm) was formed at a predetermined position relative to the black matrix pattern in the same manner as described above, except that a photosensitive colorant for a green pattern (Color Mosaic CG-7001, manufactured by Fuji Film Olin Co., Ltd.) was used. Further, a blue pattern (thickness 1.5 μm) was formed at a predetermined position relative to the black matrix pattern in the same manner as described above, except that a photosensitive colorant for a blue pattern (Color Mosaic CB-700 1, manufactured by Fuji Film Olin Co., Ltd.) was used.

Next, the three photosensitive resin compositions A-1, A-2, and A-3 as used in Example 1 were spin coated on the substrate with the colored layer formed thereon. Thus, photosensitive resin layers each having a thickness of 5 μm was formed. (First step)

The photosensitive resin layers thus formed were exposed and prebaked (second step) and developed and post-baked (third step) in the same manner as in Example 1.

A series of steps described above could provide color filters having a structure as shown in FIGS. 2 and 3. For the color filters, the thickness of the transparent protective layer $(T_2)$, the height of the protrusion in the transparent columnar convex (H), and the thickness of the columnar convex $(T_1)$ were as shown in Table 1. The results confirm that properly setting the ratio of the positive-working photosensitive resin to the negative-working photosensitive resin in the photosensitive resin layer enables simultaneous regulation of the height of the columnar convexes and the thickness of the transparent protective layer.

EXAMPLE 8

The photosensitive resin composition A-3 of Example 1 was used to form a 5 μm-thick photosensitive resin layer on a substrate with a black matrix and a colored layer formed thereon in the same manner as in Example 7. (First step)

Next, in the same manner as in Example 2, the photosensitive resin layers were then exposed at exposures on four levels as indicated in Table 2 by means of a proximity exposure machine using an ultrahigh pressure mercury lamp as an exposure light source through a photomask with openings having a predetermined shape being formed at respective positions corresponding to columnar convex-forming positions. (Second step)

The substrate was then developed by immersion in a 0.05% aqueous potassium hydroxide solution for 40 sec, rinsed, and baked in a clean oven at 200° C. for 30 min. (Third step)

A series of steps described above could provide color filters having a structure as shown in FIGS. 2 and 3. For the color filters, the thickness of the transparent protective layer $(T_2)$, the height of the protrusion in the transparent columnar convex (H), and the thickness of the columnar convex $(T_1)$ were as shown in Table 2. The results confirm that properly setting the exposure enables simultaneous regulation of the height of the columnar convexes and the thickness of the transparent protective layer.

EXAMPLE 9

At the outset, a black matrix was formed on a substrate in the same manner as in Example 7. Next, in the same manner as in Example 1, a red pattern, a green pattern, and a blue pattern were formed at respective predetermined positions relative to the black matrix pattern.

The three photosensitive resin compositions B-1, B-2, and B-3 as used in Example 3 were spin coated on the substrate with the colored layer formed thereon. Thus, photosensitive resin layers each having a thickness of 5 μm was formed. (First step)

Next, in the same manner as in Example 3, the photosensitive resin layers were exposed at an exposure of 300 mJ/cm² by means of a proximity exposure machine using an ultrahigh pressure mercury lamp as an exposure light source through a photomask with openings having a predetermined shape being formed at respective positions corresponding to columnar convex-forming positions. (Second step)

The substrate was then developed by immersion in a 0.05% aqueous potassium hydroxide solution for 40 sec, rinsed, and baked in a clean oven at 200° C. for 30 min. (Third step)

A series of steps described above could provide color filters having a structure as shown in FIGS. 2 and 3. For the color filters, the thickness of the transparent protective layer $(T_2)$, the height of the transparent columnar convex (H), and the thickness of the columnar convex $(T_1)$ were as shown in Table 3. The results confirm that properly setting the ratio of the positive-working photosensitive resin to the negative-working photosensitive resin in the photosensitive resin layer enables simultaneous regulation of the height of the columnar convexes and the thickness of the transparent protective layer.

EXAMPLE 10

The photosensitive resin composition B-2 of Example 3 was used to form a 4.5 μm-thick photosensitive resin layer on a substrate with a black matrix and a colored layer formed thereon in the same manner as in Example 7. (First step)

The photosensitive resin layer was then exposed by means of a proximity exposure machine using an ultrahigh pressure mercury lamp as an exposure light source in the same manner as in Example 1, except that the exposure was varied on four levels as indicated in Table 4 above. (Second step)

The substrate was then developed by immersion in a 0.05% aqueous potassium hydroxide solution for 40 sec, rinsed, and baked in a clean oven at 200° C. for 30 min. (Third step)

A series of steps described above could provide color filters having a structure as shown in FIGS. 2 and 3. For the color filters, the thickness of the transparent protective layer ($T_2$), the height of the protrusion in the transparent columnar convex (H), and the thickness of the columnar convex ($T_1$) were as shown in Table 4. The results confirm that properly setting the exposure enables simultaneous regulation of the height of the columnar convexes and the thickness of the transparent protective layer.

EXAMPLE 11

A 0.2 μm-thick film having a chromium oxide/chromium laminate structure was sputtered on glass 7059 (manufactured by Corning) having a short side of 300 mm, a long side of 400 mm, and a sheet thickness of 1.1 mm. Thus, a low reflective laminate having an optical density of 4.0 as measured from the glass surface side was obtained.

A photoresist (OFPR-800, manufactured by Tokyo Ohka Kogyo Co., Ltd.) was coated to a thickness of 0.5 μm. The coating was prebaked, and exposed through a mask with a predetermined pattern formed thereon, and the resist was then developed. The chromium oxide/chromium film was then etched, followed by the steps of removal of the resist, washing, and drying to form a black matrix.

A photosensitive material composition prepared by dispersing anthraquinone red pigment (a mixture of C.I. Pigment Red 177 with C.I. Pigment Yellow 139) particles of submicron in diameter in a solvent and a radical polymerization type photopolymer (acrylic polymer) and adding a benzyl methacrylate-methacrylic acid copolymer, pentaerythritol tetraacrylate, 4-[P-N,N-di(ethoxycarbonylmethyl)]-2-6-di(trichloromethyl)-s-triazine, and ethyl 3-ethoxypropionate as a solvent to regulate the solid content to 20% and the viscosity to 6.5 cP (25° C.) was coated to a thickness of 1.6 μm after the completion of the final heat treatment.

A photosensitive material prepared by dispersing a phthalocyanine green pigment (a mixture of C.I. Pigment Green 7 with Pigment Yellow 83) in the same composition as used in the red photosensitive material was then coated to a thickness of 1.8 μm in terms of the thickness after the completion of the final heat treatment.

A photosensitive material prepared by dispersing a phthalocyanine blue pigment (a mixture of C.I. Pigment Blue 15:3 with Pigment Violet 23) in the same composition as used in the red photosensitive material was then coated to a thickness of 1.8 μm in terms of the thickness after the completion of the final heat treatment.

A transparent protective layer and columnar convexes were formed as follows.

Propylene glycol monomethyl ether acetate as a solvent was added to the following negative-working photosensitive resin composition to regulate the solid dispersion concentration to 20% by weight.

| | |
|---|---|
| Bisphenol A cresol novolak epoxy acrylate | 75 pts. wt. |
| Dipentaerythritol tetraacrylate | 20 pts. wt. |
| Polymerization initiator: Irgacure 369 (manufactured by Ciba-Geigy Limited) | 5 pts. wt. |

An acrylate resin having an epoxy group in its side chain (Optomer SS6699G, manufactured by Japan Synthetic Rubber Co., Ltd.) was provided as a thermosetting resin. The negative-working photosensitive resin and the thermosetting resin were mixed together in a weight ratio of 5:1 to prepare a mixed resin composition. The mixed resin composition was coated to a thickness of 6.5 μm. The assembly in its substrate side was put on a hot plate, and prebaking was carried out at 150 for 180 sec, and ultraviolet light was then applied through a photomask having a pattern for forming a column in each of the black matrix portions.

Development was then carried out with a 0.05 wt % aqueous potassium hydroxide solution, followed by post baking at 200° C. for 30 min to form columns, with a height of 3.8 μm, integral with a 1.7 μm-thick protective film.

What is claimed is:

1. A method for forming a concave-convex pattern, comprising:

the first step of forming a photosensitive resin layer comprising an alkali-insoluble resin and a negative-working photosensitive resin on a substrate;

the second step of exposing the photosensitive resin layer through a photomask having a desired opening pattern; and the third step of developing the exposed photosensitive resin layer with an alkaline developing solution followed by curing treatment to form a concave-convex pattern consisting of convexes corresponding to the regions exposed in accordance with said opening pattern and concaves corresponding to the non-exposed regions.

2. The method according to claim 1, wherein the weight ratio of the alkali-insoluble resin to the negative-working photosensitive resin in the photosensitive resin layer formed in the first step is in the range of 1:2 to 1:10.

3. The method according to claim 1, wherein the alkali-insoluble resin is a positive-working photosensitive resin.

4. The method according to claim 3, wherein wavelengths of light to which the positive-working photosensitive resin is sensitive are different from wavelengths of light to which the negative-working photosensitive resin is sensitive, and, in the second step, the exposure is carried out using light containing wavelengths to which the negative-working photosensitive resin is sensitive.

5. The method according to claim 1, wherein the substrate is a color filter substrate, for liquid crystal displays, provided with a colored layer of a plurality of predetermined color patterns.

6. A color filter for liquid crystal displays, comprising: a substrate; a colored layer of a plurality of predetermined color patterns on the substrate; a transparent protective layer provided so as to cover at least the colored layer; and transparent columnar convexes which are provided on the substrate in its plurality of predetermined portions and are protruded from the transparent protective layer, the transparent protective layer and the columnar convexes having been formed by the method according to claim 1.

7. A method for forming a concave-convex pattern, comprising:

the first step of forming a photosensitive resin layer comprising a thermosetting resin and a negative-working photosensitive resin on a substrate and then heat treating the photosensitive resin layer in such a manner that at least a part of the thermosetting resin is cured;

the second step of exposing the photosensitive resin layer through a photomask having a desired opening pattern; and the third step of developing and curing the photosensitive resin layer to form a concave-convex pattern consisting of convexes corresponding to the regions exposed in accordance with said opening pattern and concaves corresponding to the non-exposed regions.

8. The method according to claim 7, wherein the weight ratio of the thermosetting resin to the negative-working photosensitive resin in the photosensitive resin layer formed in the first step is in the range of 1:2 to 1:10.

9. A color filter for liquid crystal displays, comprising: a substrate; a colored layer of a plurality of predetermined color patterns on the substrate; a transparent protective layer provided so as to cover at least the colored layer; and transparent columnar convexes which are provided on the substrate in its plurality of predetermined portions and are protruded from the transparent protective layer, the transparent protective layer being composed mainly of an alkali-insoluble resin, the columnar convexes being composed mainly of a cured negative-working photosensitive resin.

10. The color filter according to claim 9, wherein the alkali-insoluble resin is a positive-working photosensitive resin.

11. A color filter for liquid crystal displays, comprising: a substrate; a colored layer of a plurality of predetermined color patterns on the substrate; a transparent protective layer provided so as to cover at least the colored layer; and transparent columnar convexes which are provided on the substrate in its plurality of predetermined portions and are protruded from the transparent protective layer, the transparent protective layer being composed mainly of a thermosetting resin, the columnar convexes being composed mainly of a cured negative-working photosensitive resin.

* * * * *